(12) United States Patent
Cheng et al.

(10) Patent No.: US 9,093,478 B1
(45) Date of Patent: Jul. 28, 2015

(54) INTEGRATED CIRCUIT STRUCTURE WITH BULK SILICON FINFET AND METHODS OF FORMING

(71) Applicant: International Business Machines Corporation, Armonk, NY (US)

(72) Inventors: Kangguo Cheng, Schenectady, NY (US); Ali Khakifirooz, Los Altos, CA (US); Qizhi Liu, Lexington, MA (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/250,725

(22) Filed: Apr. 11, 2014

(51) Int. Cl.
*H01L 21/36* (2006.01)
*H01L 29/66* (2006.01)
*H01L 27/108* (2006.01)
*H01L 29/78* (2006.01)

(52) U.S. Cl.
CPC ...... *H01L 29/6681* (2013.01); *H01L 27/10826* (2013.01); *H01L 29/6653* (2013.01); *H01L 29/785* (2013.01)

(58) Field of Classification Search
USPC ......... 438/483, 156, 157, 478, 489, 498, 504, 438/752, 753
See application file for complete search history.

(56) References Cited

U.S. PATENT DOCUMENTS

| | | | |
|---|---|---|---|
| 6,458,662 B1 | 10/2002 | Yu | |
| 7,354,831 B2 | 4/2008 | Orlowski | |
| 7,517,764 B2 | 4/2009 | Booth et al. | |
| 7,989,296 B2 | 8/2011 | Lee et al. | |
| 8,134,209 B2 | 3/2012 | Yagishita et al. | |
| 8,361,869 B2 | 1/2013 | Zhou et al. | |
| 2010/0219459 A1 | 9/2010 | Orlowski et al. | |
| 2011/0198676 A1 | 8/2011 | Luo et al. | |
| 2012/0025316 A1 | 2/2012 | Schultz | |
| 2012/0138886 A1 | 6/2012 | Kuhn et al. | |
| 2013/0134516 A1 | 5/2013 | Zhou et al. | |

FOREIGN PATENT DOCUMENTS

| | | |
|---|---|---|
| WO | 9953539 A1 | 10/1999 |
| WO | 0199169 A1 | 12/2001 |
| WO | 2004114383 A2 | 12/2004 |

OTHER PUBLICATIONS

Orlowski et al., "Si, SiGe, Ge, and III-V Semiconductor Nanomembranes and Nanowires Enabled by SiGe Epitaxy", ECS Transactions, 33 (6) pp. 777-789 (2010).

*Primary Examiner* — Yasser A Abdelaziez
(74) *Attorney, Agent, or Firm* — Michael J. LeStrange; Hoffman Warnick LLC

(57) ABSTRACT

The present disclosure generally provides for an integrated circuit (IC) structure with a bulk silicon finFET and methods of forming the same. A method of forming an IC structure according to the present disclosure can include: forming a layered dummy structure on a bulk substrate, wherein the layered dummy structure includes: a first crystalline semiconductive layer; a second crystalline semiconductive layer positioned on the first crystalline semiconductive layer, wherein the second crystalline semiconductive layer comprises a material distinct from the first crystalline semiconductive layer; and a third crystalline semiconductive layer positioned on the second crystalline semiconductive layer, wherein the third crystalline semiconductive layer comprises the same material as the first crystalline semiconductive layer; forming a semiconductor fin on the layered dummy structure, wherein the semiconductor fin comprises part of a finFET structure; and selectively removing the layered dummy structure to form a cavity between the bulk substrate and the semiconductor fin.

13 Claims, 7 Drawing Sheets

US 9,093,478 B1

INTEGRATED CIRCUIT STRUCTURE WITH BULK SILICON FINFET AND METHODS OF FORMING

BACKGROUND

Embodiments of the invention relate generally to fin-shaped field effect transistors (FinFETs) formed on a bulk silicon (Si) substrate as opposed to a silicon-on-insulator (SOI) structure. More specifically, embodiments of the invention include a method of forming a bulk silicon FinFET and a resulting integrated circuit structure.

In integrated circuit (IC) structures, a transistor is a critical component for implementing digital circuitry designs. Generally, a transistor includes three electrical terminals: a source, a drain, and a gate. By applying different voltages to the gate terminal, the flow of electric current from the source to the drain can be turned on and off. A common type of transistor is a metal oxide field effect transistor (MOSFET). One type of MOSFET structure is a "FinFET," typically formed upon a semiconductor-on-insulator (SOI) layer and buried insulator layer. A FinFET can include a semiconductor structure etched into a "fin" shaped body, with one side of the fin acting as a source terminal and the other side of the fin acting as a drain terminal. A gate structure, typically composed of polysilicon and/or a metal, can be formed around one or more of the semiconductor fins. By applying a voltage to the gate structure, an electrically conductive channel can be created between the source and drain terminals of each fin in contact with the gate.

In some cases, a FinFET may be desirable in IC structures which do not include an SOI layer with a corresponding buried insulator layer. For example, manufacturing dynamic random access memory (DRAM) can include forming transistor structures on a bulk substrate instead of an SOI-type structure. Planar devices can be formed conventionally within the bulk substrate without substantial modifications. A FinFET transistor may also be adapted for use on bulk substrate material instead of SOI. Conventional approaches to forming a FinFET structure on bulk substrate include forming a placeholder material on the bulk substrate, forming the rest of the FinFET structure, and replacing the placeholder material with a local insulator. The local insulator can act as a substitute for the buried insulator layer which is absent in the bulk substrate material.

SUMMARY

A first aspect of the present disclosure provides a method of forming an integrated Circuit (IC) structure. The method can include: forming a layered dummy structure on a bulk substrate, wherein the layered dummy structure includes: a first crystalline semiconductive layer; a second crystalline semiconductive layer positioned on the first crystalline semiconductive layer, wherein the second crystalline semiconductive layer comprises a material distinct from the first crystalline semiconductive layer; and a third crystalline semiconductive layer positioned on the second crystalline semiconductive layer, wherein the third crystalline semiconductive layer comprises the same material as the first crystalline semiconductive layer; forming a semiconductor fin on the layered dummy structure, wherein the semiconductor fin comprises part of a finFET structure; and selectively removing the layered dummy structure to form a cavity between the bulk substrate and the semiconductor fin.

A second aspect of the present disclosure provides an integrated circuit (IC) structure including: a bulk substrate; a finFET located on a first region of the bulk substrate; and a layered dummy structure located on a second region of the bulk substrate, wherein the layered dummy structure includes: a first crystalline semiconductive layer; a second crystalline semiconductive layer positioned on the first crystalline semiconductive layer, wherein the second crystalline semiconductive layer comprises a material distinct from the first crystalline semiconductive layer; and a third crystalline semiconductive layer positioned on the second crystalline semiconductive layer, wherein the third crystalline semiconductive layer comprises the same material as the first crystalline semiconductive layer.

A third aspect of the present disclosure provides a method of forming an integrated circuit (IC) structure. The method can include: forming a first silicon germanium (SiGe) layer on a bulk substrate; forming a semiconductor layer on the first SiGe layer; forming a second SiGe layer on the semiconductor layer, wherein the first SiGe layer, the semiconductor layer, and the second SiGe layer comprise a layered dummy structure; forming a finFET structure on the layered dummy structure, wherein the finFET structure includes a silicon fin and a transistor gate; selectively removing the layered dummy structure to form a cavity between the bulk substrate and the finFET structure; and forming an insulator within the cavity.

BRIEF DESCRIPTION OF THE SEVERAL VIEWS OF THE DRAWINGS

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
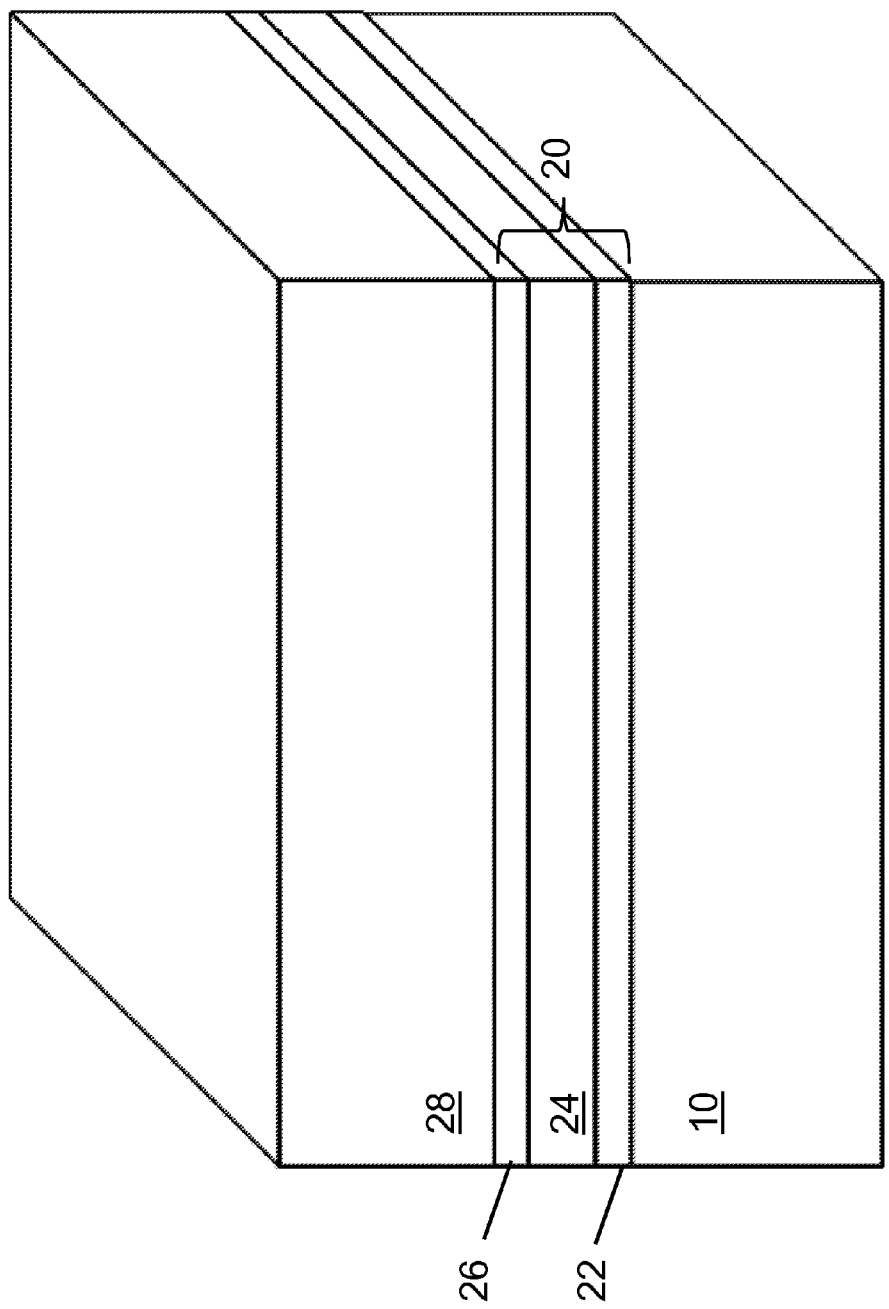
FIGS. 1-6 depict processes for forming a bulk silicon finFET according to embodiments of the present disclosure.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present disclosure relate to forming an isolated finFET on a bulk substrate, rather than a silicon-on-insulator (SOI) substrate. Bulk substrates generally include a layer or wafer of semiconductive material without buried insulator layers contained therein, in contrast to SOI substrates which include both semiconductive and insulating materials. Conventional finFETs are formed within SOI substrate materials, but can be adapted for use within a bulk substrate despite the absence of buried insulator materials. Previous methods of forming a finFET on a bulk substrate include the "silicon-on-nothing" (SON) approach. The SON approach can include, e.g., epitaxially growing silicon germanium (SiGe) on a bulk substrate, epitaxially growing a layer of silicon on the SiGe, forming fins on the layer of silicon, undercutting the SiGe to form a cavity, and filling the cavity with an insulator. Implementations of SON limit the thickness of the SiGe to a predetermined critical thickness (e.g., approximately twenty nanometers) to reduce the number of structural defects in the resulting finFET which are caused by crystallographic mismatches in the lattice size of SiGe and Silicon. This predetermined critical thickness caps the maximum thickness between the bulk substrate and the finFET. It has been discovered, however, that insulators within the critical thickness may lead to other defects, e.g., electrical shorts, or FET performance limitations after the insulator is etched during fabrication.

Aspects of the present disclosure include a bulk silicon finFET, and methods of forming the same, which allow insulators of greater thickness to be formed. Methods and apparatuses of the present disclosure allow bulk silicon finFETs to be deployed in a wider variety of situations, e.g., use of bulk silicon finFETs in embedded dynamic random access memory (DRAM). Generally, methods according to the present disclosure can form a layered "dummy structure" on a bulk substrate. The layered dummy structure can include a crystalline semiconductive layer positioned between two other crystalline semiconductive layers have a different material composition from the crystalline semiconductive layer between them. The thickness of each crystalline semiconductive layer can remain below the predetermined critical thickness, despite the layered dummy structure having a larger thickness. The finFET structure, including semiconductor fins, can be formed on top of the layered dummy structure. The layered dummy structure can then be selectively removed to form a cavity where an insulator can be formed. The thickness of the cavity or the insulator can be approximately equal to the sum of the three crystalline semiconductive layers of the layered dummy structure. As a result, the insulator between the finFET and the bulk substrate can have a greater thickness than the predetermined critical thickness of each individual layer, including the outer crystalline semiconductive layers.

Turning to FIG. 1, a process according to aspects of the present disclosure is shown. Methods of the present disclosure can include forming an integrated circuit (IC) structure, which may further include a finFET formed on a bulk substrate 10. Bulk substrate 10 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of bulk substrate 10 or a portion thereof may be strained.

Processes discussed herein can include forming a layered dummy structure 20 on bulk substrate 10. The arrangement of materials within layered dummy structure 20 can allow cavities and insulators of varying thickness to be formed in other process steps described herein. Layered dummy structure 20 can include a first crystalline semiconductive layer 22. First crystalline semiconductive layer 22 may be composed of a semiconductive material capable of having a substantially crystalline structure, and in an example embodiment can be in the form of silicon germanium (SiGe). First crystalline semiconductive layer 22 can be formed according to any currently known or later developed process of forming a material on a layer of substrate, such as bulk substrate 10. In one example, first crystalline semiconductive layer 22 can be grown epitaxially on bulk substrate 10. Epitaxial growth or "epitaxy" and can include a process by which a thin layer of single-crystal material is deposited on a single-crystal substrate. Here, epitaxial growth occurs in such a way that the crystallographic structure of the substrate is reproduced in the growing material.

Alternative techniques can include depositing first crystalline semiconductive layer 22 on bulk substrate 10. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

A second crystalline semiconductive layer 24 can be formed on first crystalline semiconductive layer 22. Second crystalline semiconductive layer 24 can be composed of a crystalline material distinct from first crystalline semiconductive layer 22, and in an example embodiment can be a layer of semiconductive material. More specifically, second crystalline semiconductive layer 24 can be composed of silicon, and can be the same type semiconductive material as bulk substrate 10 or a different material. Second crystalline semiconductive layer 24 can be formed by epitaxial growth, deposition, and/or any other currently known or later developed technique for forming a semiconductor structure. Forming layered dummy structure 20 can also include forming a third crystalline semiconductive layer 26 on second crystalline semiconductive layer 24. Use of epitaxial growth, deposition, and/or any other processes of forming a crystalline material, whether currently known or later developed, can form third crystalline semiconductive layer 26 on second crystalline semiconductive layer 24. Third crystalline semiconductive layer 26 can be composed of substantially the same material as first crystalline semiconductive layer 22, and in an example embodiment can also be composed of SiGe. Thus, second crystalline semiconductive layer 24 of layered dummy structure 20 can be distinct from first and second crystalline semiconductive layers 22, 26. Each layer of layered dummy structure 20 can also be grown in the same epitaxy chamber where desired and/or applicable.

To prepare for other process steps, e.g., forming the components of a finFET as described herein, a semiconductor layer 28 can be formed on third crystalline semiconductive layer 26 of layered dummy structure 20. Semiconductor layer 28 can be composed of the same material as bulk substrate 10, second crystalline semiconductive layer 24, or a similar semiconductor material. Applying epitaxy, deposition, and/or other currently known or later developed processes can form Semiconductor layer 28.

Forming layered dummy structure 20 and the components thereof (e.g., first, second, and third crystalline semiconductive layers 22, 24, 26) can include selecting an overall composition and dimensions for layered dummy structure 20. The composition and dimensions of each material within layered dummy structure 20 can define the critical thickness of individual layers (e.g., first and third crystalline semiconductive layers 22, 26) as well as the thickness of cavities and insulators formed in other steps. In the case of SiGe, the percent composition of germanium in first and third crystalline semiconductive layers 22, 26 can be approximately forty percent. Each material in layered dummy structure 20 can be formed to have a thickness within a predetermined range, and more specifically can be lower than a predetermined critical thickness of SiGe where applicable. As discussed elsewhere herein, SiGe or other types of crystalline semiconductive layers formed on bulk substrate 10 may have a maximum "critical thickness" to prevent defects (e.g., crystal lattice mismatches) from forming in subsequent layers formed thereon. For a desired insulator or cavity thickness of approximately fifty nanometers, first crystalline semiconductive layer 22 can be approximately ten nanometers thick, second crystalline semiconductive layer 24 can be approximately thirty nanometers thick, and third crystalline semiconductive layer 26 can be approximately ten nanometers thick. Although layered dummy structure 20 discussed by example as including at least three layers (first, second, and third crystalline semiconductive layers 22, 24, 26), it is understood that layered dummy structure 20 can include any desired number of layers. For example, layered dummy structure 20 can be composed of five layers, seven layers, nine layers, or even hundreds of layers as desired, with each layer being composed of alternating and crystallographically similar materials in each successive layer.

Processes according to the present disclosure can act on the structures shown in FIG. 1 and described herein, including layered dummy structure 20. However, some process steps may be performed on only a subset of a larger structure if desired. Thus, it is understood that other regions of bulk substrate 10, layered dummy structure 20, and/or Semiconductor layer 28 may remain intact while IC structures are being performed elsewhere. As described herein and shown in FIG. 7, a formed IC structure may be positioned close to an unprocessed portion of the same wafer or structure.

Figure 2:
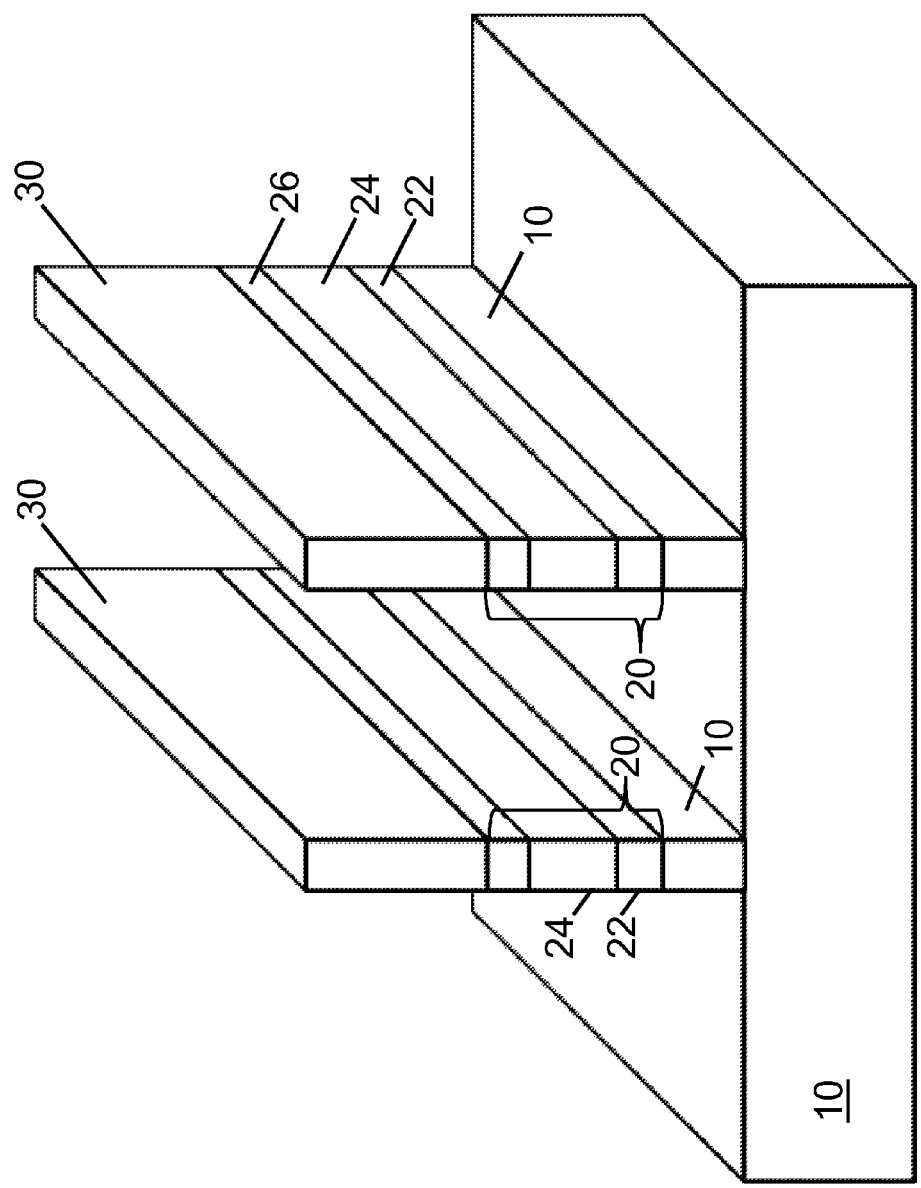

Turning to FIG. 2, methods of the present disclosure can include forming one or more semiconductor fins 30 on layered dummy structure 20. Semiconductor fins 30 can be formed, e.g., by removing portions of semiconductor layer 28 (FIG. 1), with the remaining portions of the material being used as semiconductor fins 30. In addition, portions of layered dummy structure 20 can be removed to expose portions of bulk substrate 10. Materials discussed herein can be removed according to any currently known or later developed process for removing materials from an IC structure, such as etching. "Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while leaving another material (such as polysilicon) relatively intact. The ability to selectively etch particular materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Semiconductor fins 30 can be composed of silicon or any other currently known or later developed semiconductor material, including those listed by example elsewhere herein. Semiconductor fins 30 can include the same material composition as semiconductor layer 28 (FIG. 1), and can be formed by removing portions thereof by any currently known or later developed process for removing a structure, such as etching. Although two semiconductor fins 30 are shown in FIG. 2 are shown by way of example, a single FinFET structure can include only one semiconductor fin 30, or any desired greater number of fins (e.g., five fins, ten fins, twenty fins, hundreds of fins, thousands of fins, etc.). In other processes of the present disclosure, source and drain terminals 80 (FIG. 7) for a finFET can be formed on and/or coupled to semiconductor fins 30.

Figure 3:
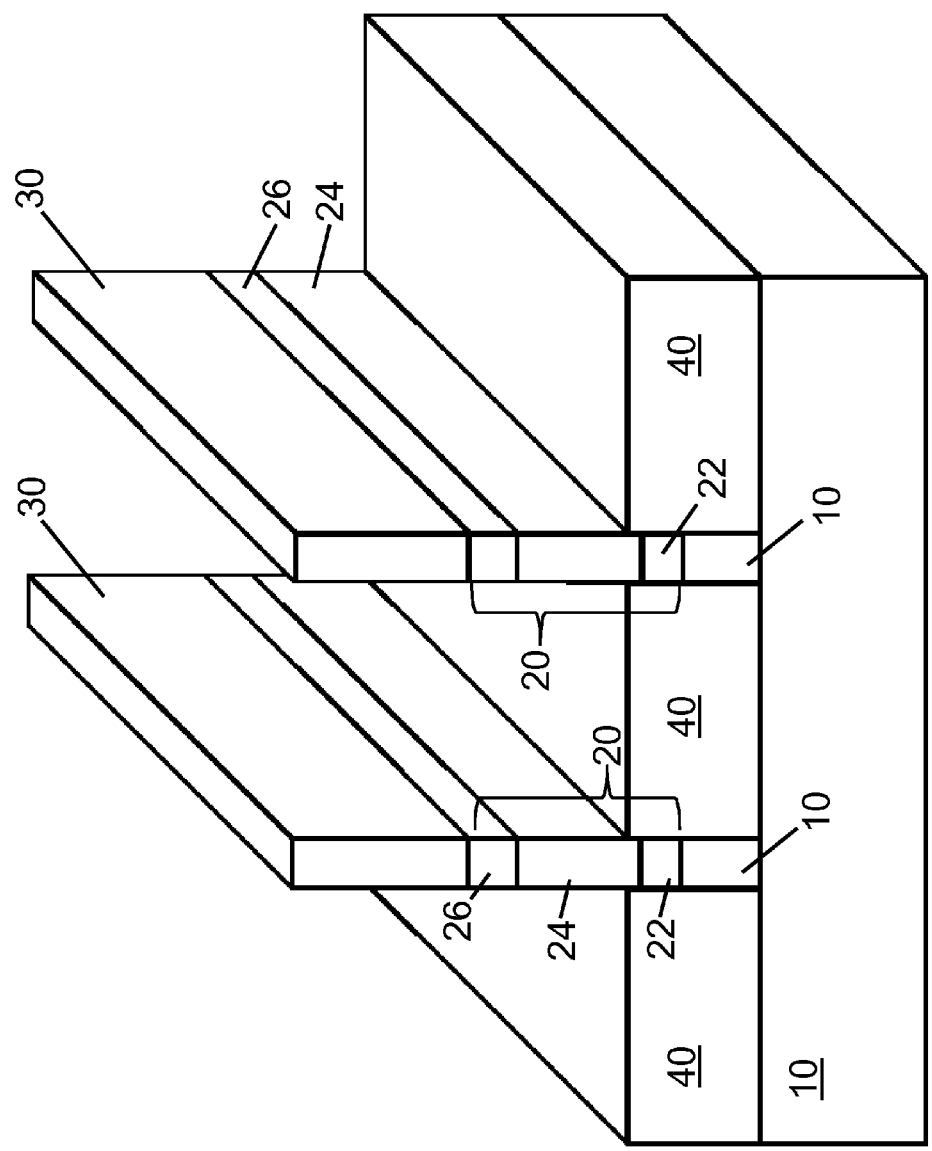

Turning to FIG. 3, Processes of the present disclosure can include forming an isolating film 40 on bulk substrate 10 adjacent to layered dummy structure 20 to electrically isolate respective structures (e.g., several layered dummy structures 20 and semiconductor fins 30) from each other. Isolating film 40 can generally include any form of electrically isolating substance, such as a dielectric material. In one example, isolating film 40 can be composed of silicon oxide ($SiO_2$). Other dielectric materials can include, e.g., silicon nitride ($Si_3N_4$), fluorinated $SiO_2$ (FSG), hydrogenated silicon oxycarbide (Si-COH), porous SiCOH, boro-phospho-silicate glass (BPSG), silsesquioxanes, near frictionless carbon (NFC), carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Isolating film 40 can be formed by deposition or deposition and etch-back or any other currently known or later developed process for forming a film of electrically insulating material.

Figure 4:
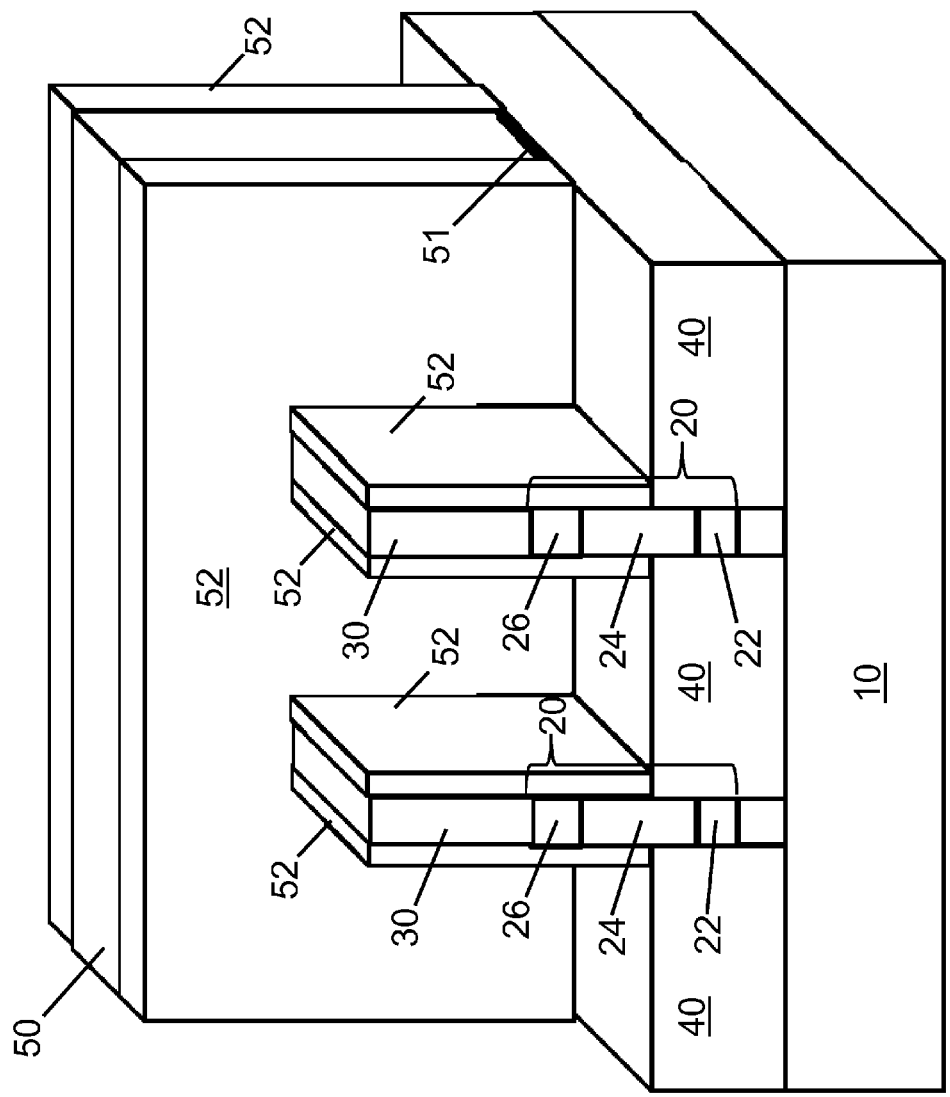

Turning to FIG. 4, processes of the present disclosure can include forming a transistor gate 50 on isolating film 40 by any currently known or later developed process, such as deposition. Transistor gate 50 can be formed above and/or around semiconductor fins 30. Transistor gate 50 can be composed of a conductive material such as, e.g., polysilicon, a metal, or a silicide. Although not shown in the cross-sectional view of FIG. 4, transistor gate 50 can be in the form of a continuous structure which "wraps" around the surface of each semiconductor fin 30 and extends across the surface of isolating film 40. As shown in FIG. 4, semiconductor fins 30 can be oriented substantially perpendicular to the structure of transistor gate 50. In this way, the voltage of a single transistor gate 50 can control the formation of a channel region within a finFET and between corresponding semiconductor fins 30. In some embodiments, transistor gate 50 can be composed of a placeholder material, which can be removed in a later fabrication process and then replaced with a functional gate material. A gate dielectric 51, such as a thin insulator composed of an oxide or other insulative material, can be formed by being grown or deposited on isolating film 40 before the forming of transistor gate 50.

One or more spacers 52 can be formed on semiconductor fins 30 and/or transistor gate 50, e.g., by being deposited onto transistor gate 50 or the surface of isolating film 40. Spacers 52 can electrically isolate transistor gate 50 from other components of an IC structure, e.g., source and drain terminals described elsewhere herein. Spacers 52 can also structurally support the structural interface between semiconductor fins 30 and transistor gate 50, allowing the resulting finFET structure to remain intact after portions of dummy structure 20 are removed. Although transistor gate 50 is shown for the purposes of illustration as having four spacers 52 thereon, it is also understood that spacers 52 can coat one or more sides of transistor gate 50. Spacers 52 can be composed of, e.g., an insulating material such as a nitride or an oxide compound, including, for example, the various types of insulating materials described herein.

Figure 5:
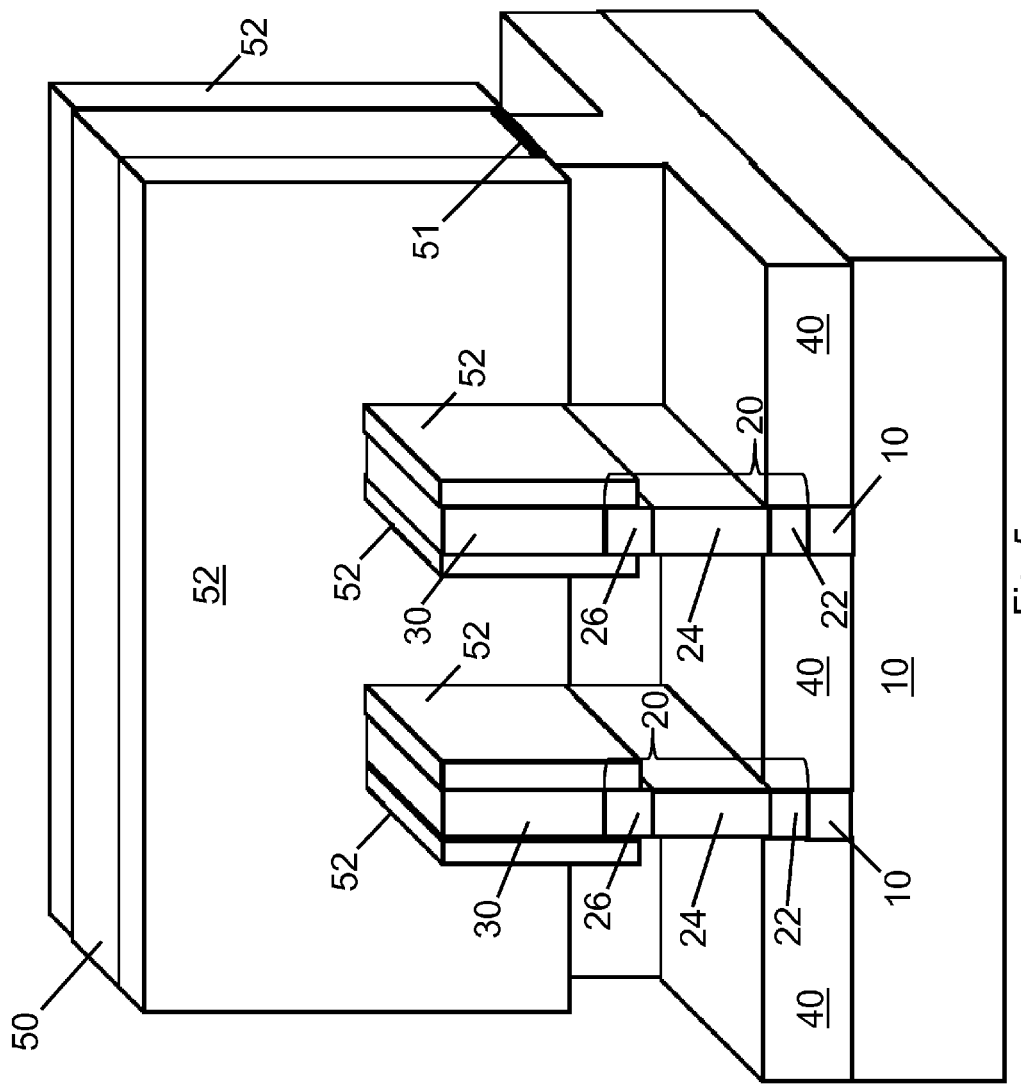

Referring to FIG. 5, portions of isolating film 40 can be removed (i.e., recessed) to expose second crystalline semiconductive layer 24 after spacers 52 are formed and thereby prepare the structure for selectively removing layered dummy structure 20. As shown in FIG. 5, removing portions of isolating film 40 can create a gap between spacers 52 and a remaining portion of isolating film 40 to expose second crystalline semiconductive layer 24. Exposing second crystalline semiconductive layer 24 of layered dummy structure 20 can allow second crystalline semiconductive layer 24 to be removed before first and third crystalline semiconductive layers 22, 26, if desired.

Figure 6:
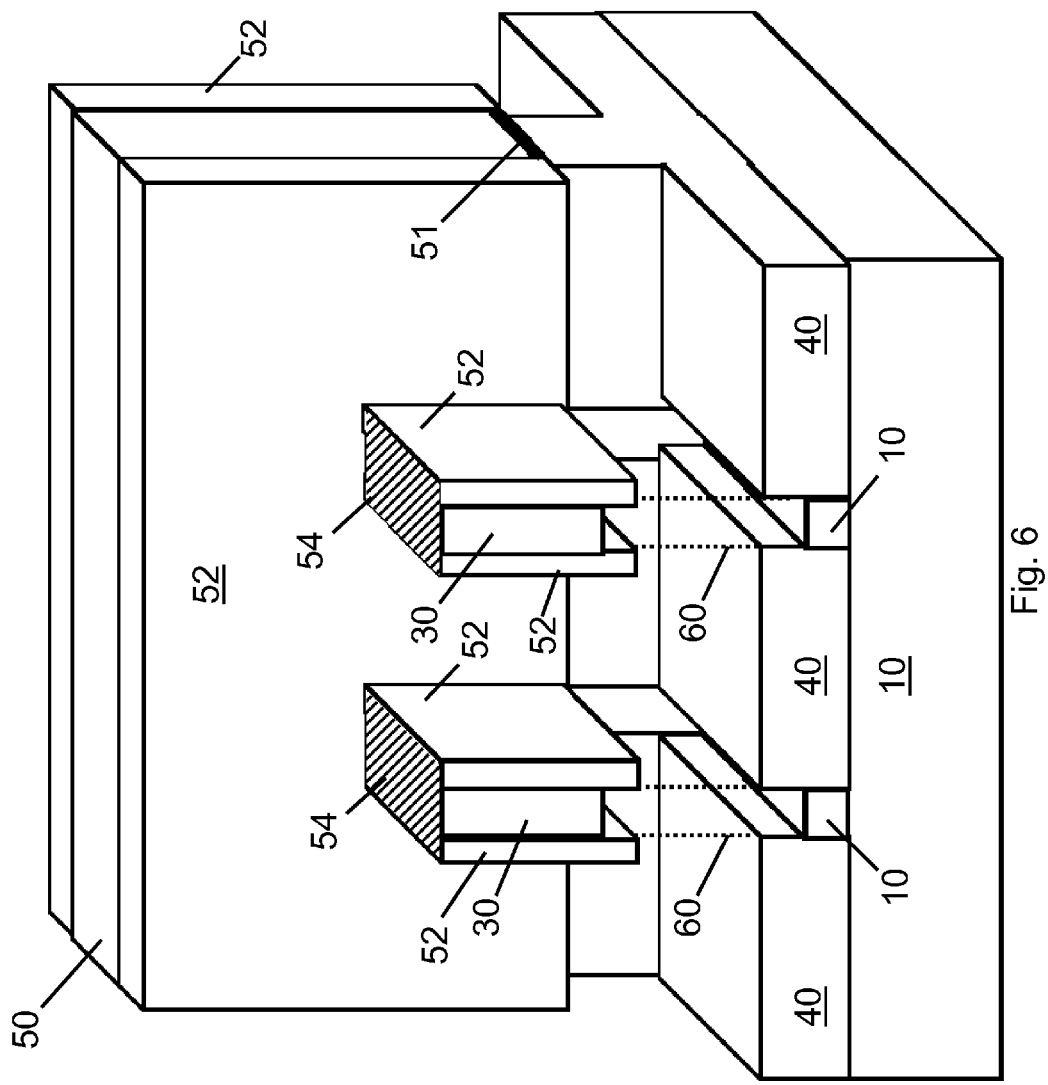

Turning now to FIG. 6, processes of the present disclosure can include selectively removing layered dummy structure 20 to electrically insulate semiconductor fins 30 from bulk substrate 10. Removing layered dummy structure 20 after forming spacers 52 can form an electrically insulative cavity 60 between semiconductor fins 30 and bulk substrate 10, thereby preventing current leakage into other structures from semiconductor fin 30 and/or transistor gate 50. As described elsewhere herein, forming an insulator within cavity 60 can further isolate a finFET and components thereof from bulk substrate 10. Selectively removing layered dummy structure 20 can include removing second crystalline semiconductive layer 24 (FIGS. 1-5) before removing first and third crystalline semiconductive layers 22, 26 (FIGS. 1-5). To remove second crystalline semiconductive layer 24 (FIGS. 1-5), a user can chemically etch second crystalline semiconductive layer 24 (FIGS. 1-5) with a material for removing semiconductive structures, such as potassium oxide, to remove second crystalline semiconductive layer 24. In the case of chemical etching, semiconductor fins 30 can remain intact because of being protected with spacers 52 and optionally with a fin-top hard mask 54 being temporarily placed on each semiconductor fin 30. First and third crystalline semiconductive layers 22, 26 (FIGS. 1-5) can be selectively removed, for example, by way of phosphorically etching and removing the crystalline material (e.g., SiGe compounds) from the surfaces of bulk substrate 10 and semiconductor fin 30. The materials within layered dummy structure 20 can alternatively be removed by other currently known or later developed selective removal processes or materials.

Figure 7:
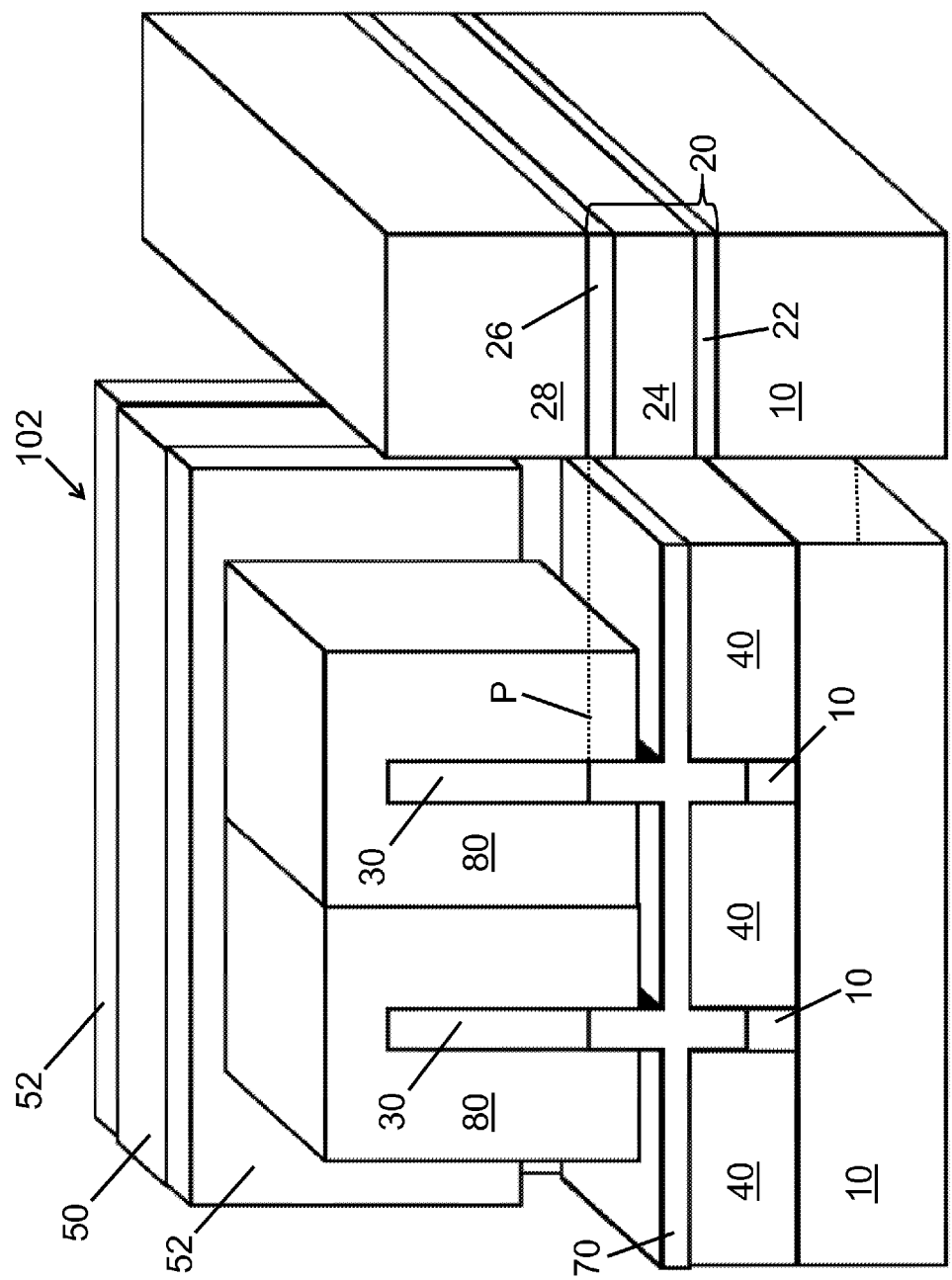
FIG. 7 is a perspective view of an integrated circuit (IC) structure according to embodiments of the present disclosure.

Turning to FIG. 7, remaining processes of forming a bulk silicon finFET and corresponding integrated circuit (IC) structure 100 are shown. Processes of the present disclosure can include forming an insulator 70 between bulk substrate 10 and semiconductor fin 30, such that the thickness of insulator 70 between bulk substrate 10 and semiconductor fin 30 is substantially equal to the thickness of layered dummy structure 20. Insulator 70 can be formed beneath semiconductor fins 30, e.g., by being composed of a flowable or conformal oxide formed with a back fill process. Insulator 70 in the form of a flowable oxide can be annealed to densify insulator 70. Insulator 70 can have a greater thickness than insulators between a finFET structure and bulk silicon produced with other methods. Methods of the present disclosure can include removing spacers 52 from semiconductor fins 30, and forming terminals 80 on the surface of semiconductor fins 30. Terminals 80 can be composed of an electrically conductive material, such as a metal, and can be formed on semiconductor fins 30 by deposition, epitaxy, or another currently known or later developed process.

Embodiments of the processes described herein can form an IC structure 100 as shown in FIG. 7. IC structure 100 can include bulk substrate 10, which is shown with a broken section to designate an indeterminate length. A finFET 102 can be located on bulk substrate 10 and can include, e.g., semiconductor fins 30, transistor gate 50, terminals 80, gate dielectric 51 and any other transistor components coupled thereto. Although IC structure 100 is shown with only one finFET 102 in FIG. 7, it is understood that IC structure 100 can include any desired number of finFETs based on the dimensions of bulk substrate 10. As one or more finFETs 102 are formed, remaining regions of bulk substrate 10 may retain layered dummy structure 20 thereon. The remaining regions of bulk substrate 10 which include layered dummy structure 20 can indicate that processes according to the present disclosure have been performed. As discussed elsewhere herein, layered dummy structure 20 can include first and third crystalline semiconductive layers 22, 26 and second crystalline semiconductive layer 24 positioned therebetween. Furthermore, a semiconductor layer 28 can be positioned on layered dummy structure 20 and can be used to form other components, including additional finFETs 102.

IC structure 100 can also include insulator 70 and the remainder of isolating film 40 positioned between bulk substrate 10 and finFET 102. The thickness of insulator 70 between bulk substrate 10 and finFET 102 can be predetermined and substantially equal to the thickness of layered dummy structure 20 used in processes of forming IC structure 100. In an example embodiment, the thickness of insulator 70 can exceed a critical thickness of a particular crystalline material (e.g., SiGe) and for example can have a thickness of at least approximately fifty nanometers. The alignment between finFET 102 and layered dummy structure 20 can also indicate that IC structure 100 is formed according to aspects of the present disclosure. For instance, the interface between insulator 70 and semiconductor fin 30 can be substantially coplanar along line P with the interface between layered dummy structure 20 and semiconductor layer 28. This feature can signify that layered dummy structure 20 was used to form an insulator 70 with particular dimensions. IC structure 100 can be deployed in a variety of contexts. For example, finFET 102 of IC structure 100 can form part of a dynamic random access memory (DRAM) component because of being formed on bulk substrate 10.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an integrated Circuit (IC) structure, the method comprising:
   forming a layered dummy structure on a bulk substrate, wherein the layered dummy structure includes:
      a first crystalline semiconductive layer;
      a second crystalline semiconductive layer positioned on the first crystalline semiconductive layer, wherein the second crystalline semiconductive layer comprises a material distinct from the first crystalline semiconductive layer; and
      a third crystalline semiconductive layer positioned on the second crystalline semiconductive layer, wherein the third crystalline semiconductive layer comprises the same material as the first crystalline semiconductive layer;
   forming a semiconductor fin on the layered dummy structure, wherein the semiconductor fin comprises part of a finFET structure; and
   selectively removing the layered dummy structure to form a cavity between the bulk substrate and the semiconductor fin.

2. The method of claim 1, further comprising forming an insulator within the cavity, wherein a thickness of the formed insulator is substantially equal to a thickness of the layered dummy structure.

3. The method of claim 1, wherein the forming of the layered dummy structure includes epitaxially growing the first and third crystalline semiconductive layers.

4. The method of claim 1, further comprising forming an isolating film on the bulk substrate adjacent to the layered dummy structure.

5. The method of claim 4, wherein the isolating film comprises silicon oxide ($SiO_2$).

6. Method of claim 1, further comprising forming a transistor gate on the isolating film, and forming a spacer on the transistor gate and the semiconductor fin.

7. The method of claim 1, further comprising removing a portion of the isolating film to expose the second crystalline semiconductive layer of the layered dummy structure.

8. The method of claim 1, wherein the selective removing of the layered dummy structure includes chemically etching the second crystalline semiconductive layer of the layered dummy structure.

9. The method of claim 1, wherein the selective removing of the layered dummy structure includes phosphorically etching one of the first and third crystalline semiconductive layers of the layered dummy structure.

10. The method of claim 1, wherein the first and third crystalline semiconductive layers of the layered dummy structure comprise silicon germanium (SiGe), and the second crystalline semiconductive layer of the layered dummy structure comprises a crystalline semiconductor.

11. A method of forming an integrated circuit (IC) structure, the method comprising:
    forming a first silicon germanium (SiGe) layer on a bulk substrate;
    forming a semiconductor layer on the first SiGe layer;
    forming a second SiGe layer on the semiconductor layer, wherein the first SiGe layer, the semiconductor layer, and the second SiGe layer comprise a layered dummy structure;
    forming a finFET structure on the layered dummy structure, wherein the finFET structure includes a silicon fin and a transistor gate;
    selectively removing the layered dummy structure to form a cavity between the bulk substrate and the finFET structure; and
    forming an insulator within the cavity.

12. The method of claim 11, further comprising:
    forming an isolating film on the bulk substrate before selectively removing the layered dummy structure; and
    forming a spacer on each of the silicon fin, the transistor gate, and the isolating film.

13. The method of claim 12, further comprising removing a portion of the isolating film below the spacer to expose the semiconductor layer of the layered dummy structure.

* * * * *